(12) United States Patent
Bakker et al.

(10) Patent No.: US 7,138,824 B1
(45) Date of Patent: Nov. 21, 2006

(54) INTEGRATED MULTI-FUNCTION ANALOG CIRCUIT INCLUDING VOLTAGE, CURRENT, AND TEMPERATURE MONITOR AND GATE-DRIVER CIRCUIT BLOCKS

(75) Inventors: Gregory Bakker, San Jose, CA (US); Rabindranath Balasubramanian, Dublin, CA (US)

(73) Assignee: Actel Corporation, Mountain View, CA (US)

( * ) Notice: Subject to any disclaimer, the term of this patent is extended or adjusted under 35 U.S.C. 154(b) by 8 days.

(21) Appl. No.: 11/016,699

(22) Filed: Dec. 17, 2004

Related U.S. Application Data

(63) Continuation-in-part of application No. 10/843,701, filed on May 10, 2004.

(51) Int. Cl.
*H03H 17/16* (2006.01)
(52) U.S. Cl. .......................... 326/32; 326/37
(58) Field of Classification Search ............... 326/32, 326/37; 341/126, 141
See application file for complete search history.

(56) References Cited

U.S. PATENT DOCUMENTS

| | | | | |
|---|---|---|---|---|
| 4,503,494 A | 3/1985 | Hamilton et al. | ......... | 364/200 |
| 4,758,745 A | 7/1988 | Elgamal et al. | ......... | 307/465 |
| 4,855,954 A | 8/1989 | Turner et al. | ......... | 365/185 |
| 4,870,302 A | 9/1989 | Freeman | ......... | 307/465 |
| 4,879,688 A | 11/1989 | Turner et al. | ......... | 365/201 |
| 5,101,122 A | 3/1992 | Shinonara | ......... | 307/465 |
| 5,132,571 A | 7/1992 | McCollum et al. | ...... | 307/465.1 |
| 5,237,218 A | 8/1993 | Josephson et al. | ......... | 307/465 |
| 5,237,699 A | 8/1993 | Little et al. | ......... | 395/750 |
| 5,336,951 A | 8/1994 | Josephson et al. | ......... | 307/465 |
| 5,451,912 A | 9/1995 | Torode | ......... | 331/108 C |
| 5,559,449 A | 9/1996 | Padoan et al. | ......... | 326/40 |
| 5,563,526 A | 10/1996 | Hastings et al. | ......... | 326/37 |
| 5,564,526 A | 10/1996 | Hastings et al. | ......... | 326/37 |
| 5,684,434 A | 11/1997 | Mann et al. | ......... | 331/16 |
| 5,687,325 A * | 11/1997 | Chang | ......... | 710/104 |
| 5,811,987 A | 9/1998 | Ashmore, Jr. et al. | ......... | 326/39 |
| 5,821,776 A | 10/1998 | McGowan | ......... | 326/41 |
| 5,877,656 A | 3/1999 | Mann et al. | ......... | 331/16 |
| 5,889,701 A | 3/1999 | Kang et al. | ......... | 365/185.18 |
| 5,949,987 A | 9/1999 | Curd et al. | ......... | 395/500.17 |
| 5,999,014 A | 12/1999 | Jacobson et al. | ......... | 326/38 |
| 6,034,541 A | 3/2000 | Kopec, Jr. et al. | ......... | 326/39 |
| 6,091,641 A | 7/2000 | Zink | ......... | 365/185.28 |
| 6,104,257 A | 8/2000 | Mann | ......... | 331/158 |
| 6,134,707 A | 10/2000 | Herrmann et al. | ......... | 717/5 |
| 6,145,020 A | 11/2000 | Barnett | ......... | 710/8 |
| 6,150,837 A * | 11/2000 | Beal et al. | ......... | 326/39 |
| 6,191,660 B1 | 2/2001 | Mar et al. | ......... | 331/111 |
| 6,243,842 B1 | 6/2001 | Slezak et al. | ......... | 714/724 |
| 6,246,258 B1 * | 6/2001 | Lesea | ......... | 326/39 |

(Continued)

OTHER PUBLICATIONS

Author: Anonymous, 4-pin μP Voltage Monitors with Manual Reset Input, Maxim Integrated Products, document 19-0411; Rev 3; Mar. 1999, pp. 1-8.

(Continued)

*Primary Examiner*—Vibol Tan
(74) *Attorney, Agent, or Firm*—Sierra Patent Group, Ltd.

(57) ABSTRACT

An integrated multi-function analog circuit includes at least one MOSFET gate-drive circuit coupled to a first I/O pad. At least one voltage-sensing circuit is coupled to a second I/O pad. At least one current-sensing circuit is coupled to the second I/O pad and a third I/O pad. At least one temperature-sensing circuit is coupled to a fourth I/O pad.

13 Claims, 6 Drawing Sheets

U.S. PATENT DOCUMENTS

| | | | |
|---|---|---|---|
| 6,260,087 B1 | 7/2001 | Chang | 710/100 |
| 6,272,646 B1 | 8/2001 | Rangasayee et al. | 713/500 |
| 6,304,099 B1 | 10/2001 | Tang et al. | 326/38 |
| 6,334,208 B1 | 12/2001 | Erickson | 716/17 |
| 6,346,905 B1 | 2/2002 | Ottini et al. | 341/159 |
| 6,356,107 B1 | 3/2002 | Tang et al. | 326/40 |
| 6,389,321 B1 | 5/2002 | Tang et al. | 700/2 |
| 6,396,168 B1 | 5/2002 | Ghezzi et al. | 307/44 |
| 6,408,432 B1 | 6/2002 | Herrmann et al. | 717/139 |
| 6,414,368 B1 | 7/2002 | May et al. | 257/523 |
| 6,415,344 B1 | 7/2002 | Jones et al. | 710/105 |
| 6,433,645 B1 | 8/2002 | Mann et al. | 331/18 |
| 6,442,068 B1 | 8/2002 | Bartoli et al. | 365/185.12 |
| 6,483,344 B1 | 11/2002 | Gupta | 326/41 |
| 6,490,714 B1 | 12/2002 | Kurniawan et al. | 716/17 |
| 6,515,551 B1 | 2/2003 | Mar et al. | 331/111 |
| 6,526,557 B1 | 2/2003 | Young et al. | 716/16 |
| 6,552,935 B1 | 4/2003 | Fasoli | 365/185.33 |
| 6,594,192 B1 | 7/2003 | McClure | 365/225.7 |
| 6,600,355 B1 | 7/2003 | Nguyen | 327/298 |
| 6,614,320 B1 | 9/2003 | Sullam et al. | 331/46 |
| 6,617,875 B1 * | 9/2003 | El-Ayat | 326/38 |
| 6,651,199 B1 | 11/2003 | Shokouhi | 714/727 |
| 6,674,332 B1 | 1/2004 | Wunner et al. | 331/18 |
| 6,748,577 B1 | 6/2004 | Bal | 716/16 |
| 6,753,739 B1 | 6/2004 | Mar et al. | 331/176 |
| 6,791,353 B1 * | 9/2004 | Beal et al. | 326/39 |
| 2001/0030554 A1 | 10/2001 | Ghezzi et al. | 326/39 |
| 2002/0007467 A1 | 1/2002 | Ma et al. | 713/501 |
| 2002/0108006 A1 | 8/2002 | Snyder | 710/100 |
| 2003/0001614 A1 | 1/2003 | Singh et al. | 326/40 |
| 2003/0005402 A1 | 1/2003 | Bal | 716/16 |
| 2003/0074637 A1 | 4/2003 | Pavesi et al. | 716/1 |
| 2003/0210585 A1 | 11/2003 | Bernardi et al. | 365/200 |
| 2003/0210599 A1 | 11/2003 | McClure | 365/225.7 |
| 2003/0214321 A1 | 11/2003 | Swami et al. | 326/38 |
| 2004/0008055 A1 | 1/2004 | Khanna et al. | 326/40 |
| 2004/0036500 A1 | 2/2004 | Bratt | 326/39 |

OTHER PUBLICATIONS

Author: Anonymous, "Fan Controller and Remote Temperature Sensor with SMBus Serial Interface" for MAX1669, Maxim Integrated Products, document 19-1575; Rev 0; Jan. 2000, pp. 1-20.

Author: Anonymous, "Precision RESET Controller and 4K I$^2$C Memory With Both RESET ad RESET Outputs" for S24042/S24043, Summit Microelectronics, Inc., document 2011 2.0 May 2, 2000, pp. 1-14.

Author: Anonymous, "SOT23, Low-Power µP Supervisory Circuits with Battery Backup and Chip-Enable Gating" for MAX6365-MAX6368, Maxim Integrated Products, document 19-1658; Rev 1; Jun. 2001, pp. 1-15.

Author: Anonymous, "Cypress MicroSystems PsoC Microcontrollers Now Available in Volume", Cypress Semiconductor Corporation Press Release Sep. 5, 2001 [Internet: mhtml:file://D:\Act401\Cypress%20Semiconductor%20Corporation.mht].

Author: Anonymous, "nvSRAM—SRAM and EEPROM within a single chip" ZMD AG, pp. 1-4, Oct. 2001.

Author: Anonymous, "Intelligent Temperature Monitor and Dual PWM Fan Controller" for ADM1031, Analog Devices, pp. 1-32, 2003 (no month).

Author: Anonymous, "LM63 ±1°C/±3°C Accurate Remote Diode Digital Temperature Sensor with Integrated Fan Control", National Semiconductor Corporation, document DS200570, pp. 1-28, May 2003.

Author: Anonymous, "PsoC™ Configurable Mixed-Signal Array with On-board Controller", CY8C25122, CY8C26233, CY8C26443, CY8C26643, Device Data Sheet for Silicon Revision D, Cypress MicroSystems Document π: 38-12010 CY Rev. *B CMS Rev. 3.22, pp. 1-150, Aug. 18, 2003.

Author: Anonymous, "PSoC™ Mixed Signal Array", Preliminary Data Sheet for CY8C29466, CY8C29566, CY8C29666, and CY8C29866, Cypress MicroSystems Document No. 38-12013 Rev. *D., pp. 1-41, Jun. 2004.

* cited by examiner

INTEGRATED MULTI-FUNCTION ANALOG CIRCUIT INCLUDING VOLTAGE, CURRENT, AND TEMPERATURE MONITOR AND GATE-DRIVER CIRCUIT BLOCKS

CLAIM FOR PRIORITY

This application is a continuation-in-part of co-pending application Ser. No. 10/843,701, filed May 10, 2004.

BACKGROUND OF THE INVENTION

1. Field of the Invention

The present invention relates to integrated circuits. More particularly, the present invention relates to an integrated circuit device including a multi-function analog circuit that contains voltage, current, and temperature monitor blocks and a gate-driver circuit block.

2. Background

Integrated circuits that perform both analog and digital functions are known in the art. Recent developments include system-on-a-chip integrated circuits that include programmable logic that may be programmably coupled to one or more analog circuits disposed on the same integrated circuit, multichip module or flip-chip assembly.

Traditionally, FPGAs and other programmable logic devices (PLDs) have been limited to providing digital logic functions programmable by a user. Recently, however, FPGA manufacturers have experimented with adding application specific integrated circuit (ASIC) blocks onto their devices (See, e.g., U.S. Pat. No. 6,150,837). Such ASIC blocks have included analog circuits (see U.S. Pat. No. 5,821,776). In addition, ASIC manufacturers have embedded programmable logic blocks in their devices to add programmable functionality to otherwise hardwired devices (See, e.g., devices offered (or formerly offered) by Triscend Corporation, Adaptive Silicon Inc., and Chameleon Systems.

SUMMARY OF THE INVENTION

An integrated multi-function analog circuit includes at least one MOSFET gate-drive circuit coupled to a first I/O pad. At least one voltage-sensing circuit is coupled to a second I/O pad. At least one current-sensing circuit is coupled to the second I/O pad and a third I/O pad. At least one temperature-sensing circuit is coupled to a fourth I/O pad.

According to one aspect of the invention, at least one of the first through fourth I/O pads may be used to provide a digital input to the integrated circuit. According to another aspect of the invention, the gate-drive circuit is configured to drive either p-channel or n-channel external transistors. According to another aspect of the invention, the gate-drive circuit is also configured to provide a switched ground for driving an external load. According to another aspect of the invention, a scaling circuit may be provided between at least one of the second third and fourth I/O pads and the sensing circuits to which they are connected. According to another aspect of the invention, the outputs of the sensing circuits according to the present invention may be input to an analog-to-digital converter to produce a digital output to be used by digital circuitry on the integrated circuit.

A better understanding of the features and advantages of the present invention will be obtained by reference to the following detailed description of the invention and accompanying drawings, which set forth an illustrative embodiment in which the principles of the invention are utilized.

DETAILED DESCRIPTION

Those of ordinary skill in the art will realize that the following description of the present invention is illustrative only and not in any way limiting. Other embodiments of the invention will readily suggest themselves to such skilled persons.

Figure 1:
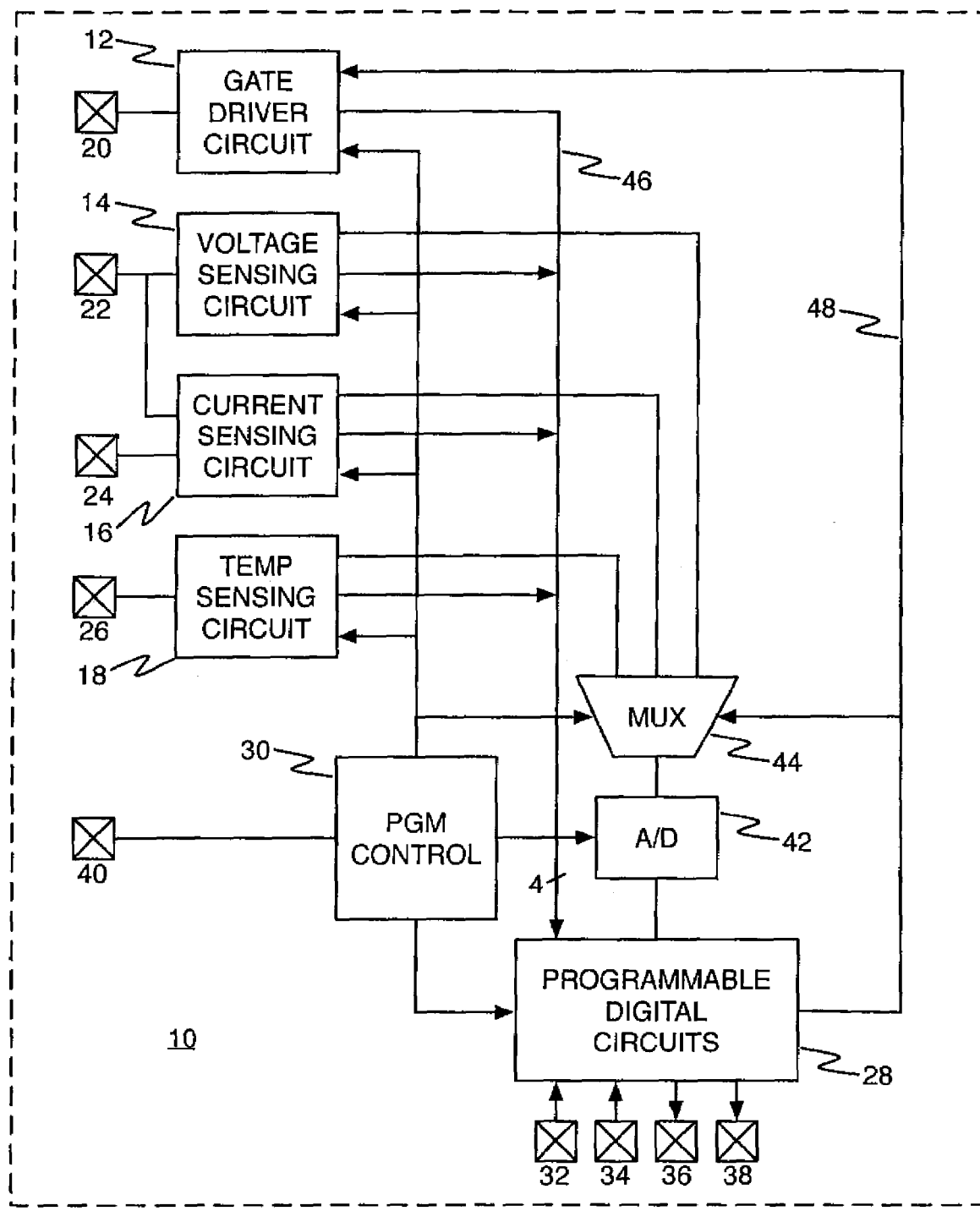
FIG. 1 is a block diagram of an illustrative integrated circuit employing the integrated multi-function analog circuit of the present invention.

Referring first to FIG. 1, an integrated circuit 10 according to the present invention includes a gate-driver circuit 12, a voltage-sensing circuit 14, a current-sensing circuit 16, and a temperature-sensing circuit 18. Gate-driver circuit 12 is coupled to I/O pad 20, voltage-sensing circuit 14 is coupled to I/O pad 22, current-sensing circuit 16 is coupled to I/O pad 24, and temperature-sensing circuit 18 is coupled to I/O pad 26.

Integrated circuit 10 also includes programmable digital circuits 28 and a program control block 30. Programmable digital circuits 28 may include, for example, a field-programmable gate array (FPGA). Program control block 30 may include control circuitry for programming the FPGA and controlling the functions and connections in the gate-driver circuit 12, voltage-sensing circuit 14, current-sensing circuit 16, and temperature-sensing circuit 18.

Programmable digital circuits 28 may be coupled to a plurality of I/O pads 32, 34, 36, and 38 that serve as inputs and outputs for digital signals handled by programmable digital circuits 28. Persons of ordinary skill in the art will appreciate that the two input I/O pads 32 and 34 and the two output I/O pads 36 and 36 are illustrative and the actual number will vary as needed by the designer. Such skilled persons will also appreciate that I/O pads 32, 34, 36, and 38 may not be hardwired as inputs and outputs but may be designated as inputs and outputs by programming connections between them and the programmable digital circuits 28 as is well known in the art. I/O pads 20, 22, 24, and 26 may be configured as digital inputs that may be coupled to the programmable digital circuitry through lines 46.

Program control block 30 may also include programmable elements, such as non-volatile memory cells, volatile memory cells such as SRAM, antifuses, or the like, necessary to define the functions and connectivity of the programmable logic inside programmable digital circuits 28 and the gate-driver circuit 12, voltage-sensing circuit 14, current-sensing circuit 16, and temperature-sensing circuit 18. Persons of ordinary skill in the art will realize that program control block 30 is conceptual and that the individual programmable elements may be physically distributed throughout the integrated circuit 10 in a known manner to control the programmable circuit elements. Program control block 30 is shown coupled to a representative I/O pad 40. Persons skilled in the art will appreciate that single I/O pad 40 may be understood to represent a JTAG port or other known means for programming the programmable elements on integrated circuit 10.

The outputs of voltage-sensing circuit 14, current-sensing circuit 16, and temperature-sensing circuit 18 are coupled to A/D converter 42 through multiplexer 44. The address inputs of multiplexer 44 may be driven by lines 48 from circuits configured in programmable digital circuits 28 to allow dynamic selection between the outputs of voltage-sensing circuit 14, current-sensing circuit 16, and temperature-sensing circuit 18. In other embodiments of the invention where dynamic selection of the signal source for A/D converter 42 is not necessary, the address inputs of multiplexer 44 may be driven from program control circuitry 30.

The set of multi-function analog circuits shown in FIG. 1 has four members including gate-driver circuit 12, voltage-sensing circuit 14, current-sensing circuit 16, and temperature-sensing circuit 18. Persons of ordinary skill in the art will realize that FIG. 1 is illustrative only, and a set of analog I/O circuits in an actual integrated circuit may have fewer or more members.

Figure 2:
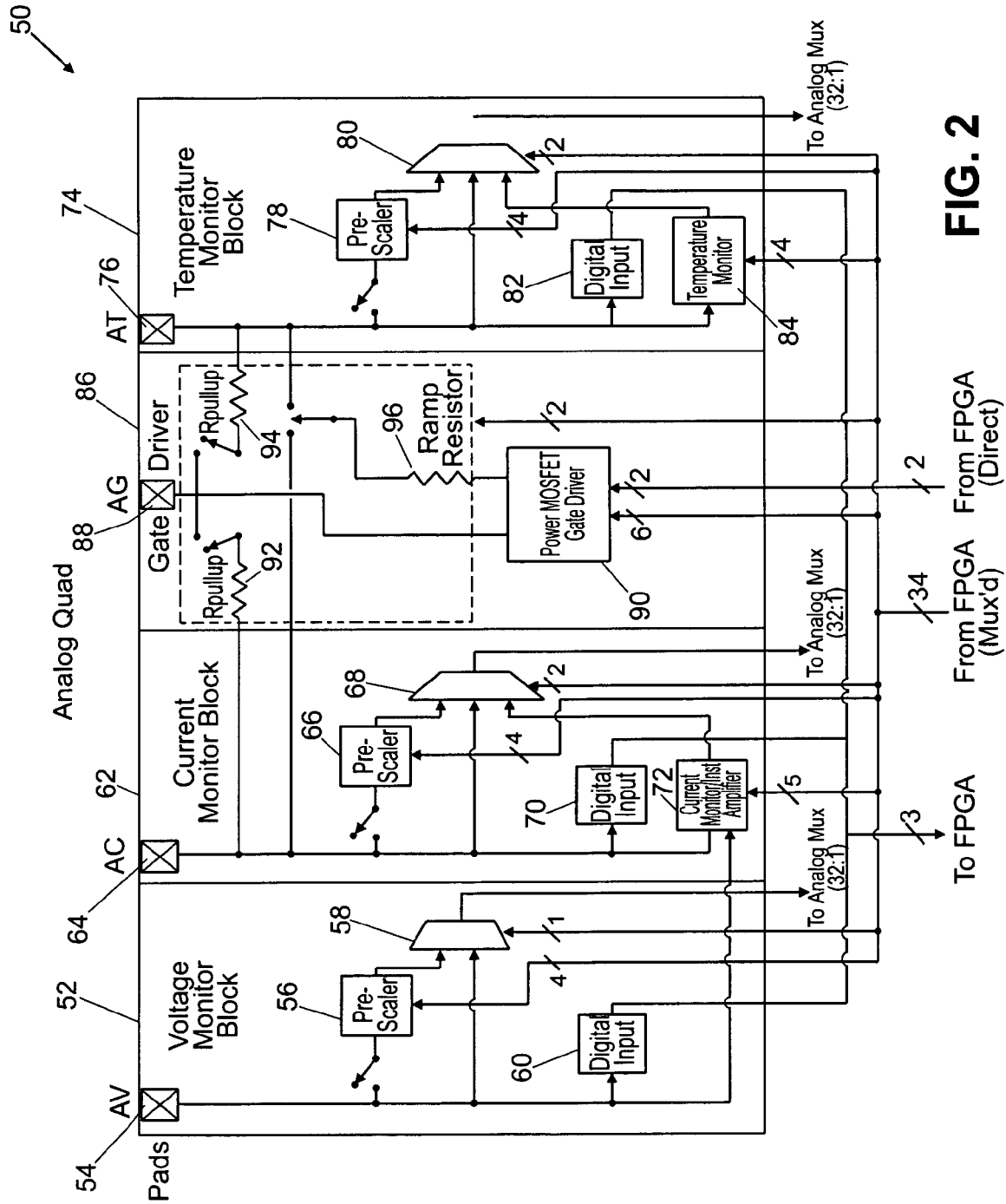
FIG. 2 is a block diagram of one illustrative embodiment of an integrated multi-function analog circuit according to one aspect of the present invention.

Referring now to FIG. 2, a block diagram shows one illustrative embodiment of an integrated multi-function analog circuit 50 according to one aspect of the present invention. Multi-function analog circuit 50 includes a voltage-sensing block 52 coupled to I/O pad 54. I/O pad 54 may either have a direct connection to the input of A/D converter 42 of FIG. 1 (or one input of its input multiplexer 44), or may be connected to it through a buffered prescaler circuit 56. Prescaler circuit 56 may have a programmable gain set to 1 of n selectable values as will be disclosed further herein. Multiplexer 58 is employed to select between the direct input or the prescaled input. The select inputs of multiplexer 58 may be controlled from the programmable digital circuits 28 by control lines 48 (FIG. 1). According to another aspect of the present invention, I/O pad 54 can be configured through digital input circuit 60 as a low-performance digital input to the programmable digital circuits 28 of FIG. 1.

A second member 62 of the set may be a current-monitor input block coupled to I/O pad 64. Like I/O pad 54, I/O pad 64 may either have a direct connection to the input of A/D converter 42 (or one input of its input multiplexer 44), or may be connected to it through a buffered prescaler 66. Like prescaler 56, prescaler 66 may have a programmable gain set to 1 of n selectable values as will be disclosed further herein. Multiplexer 68 is employed to select between the direct input from I/O pad 64 or the prescaled input. The select inputs of multiplexer 68 may be controlled from the programmable digital circuits 28 by control lines 48 (FIG. 1). Like I/O pad 54, I/O pad 64 can be configured through digital input circuit 70 as a low-performance digital input to the programmable digital circuits 28

In addition to the functions that are identical to that for I/O pad 54, current-sensing circuit 62 may be used to measure the voltage difference between I/O pad 54 and I/O pad 64. This may be used to measure a voltage drop across a small external resistor in series with an external power supply. I/O pad 64 is connected to one input of an amplifier 72. The other input of amplifier 72 is coupled to I/O pad 54. The output of amplifier 72 is presented to a third input of multiplexer 68. If a low value (e.g., 0.1 ohms) resistor (not shown in FIG. 2) is coupled between I/O pads 54 and 62, and a voltage supply potential is coupled to I/O pad 54 and a load is coupled to I/O pad 64, the voltage drop across that resistor can be sensed and amplified by amplifier 72. That voltage drop is directly proportional to the current flowing through the resistor. An illustrative configuration for amplifier 160 is shown and described with reference to FIG. 4.

A third member 74 of the set may be a temperature-sensor input block coupled to I/O pad 76. Like I/O pad 54, I/O pad 76 may either have a direct connection to the input of A/D converter 42 (or one input of its input multiplexer 44), or may be connected to it through a buffered prescaler 78. Like prescaler 56, prescaler 78 may have a programmable gain set to 1 of n selectable values as will be disclosed further herein. Multiplexer 80 is employed to select between the direct input from I/O pad 76 or the prescaled input. The select inputs of multiplexer 80 may be controlled from the programmable digital circuits 28 by control lines 48 (FIG. 1). Like I/O pad 54, I/O pad 76 can be configured through digital input circuit 82 as a low-performance digital input to the programmable digital circuits 28.

In addition to the functions that are identical to that for I/O pad 54, temperature-sensing circuit 74 may be used as a temperature monitor for a signal on I/O pad 76. This temperature-sensing circuit 74 may be configured to measure temperature of an external diode by taking advantage of the temperature behavior of the I-V characteristics of a diode. A temperature-sensor circuit 84 may also be coupled to an input of multiplexer 80. An integrated circuit according to the present invention may be supplied with a plurality of temperature monitor circuits. According to one embodiment of the invention, a number of temperature sensors are for measuring external temperature (e.g., the junction temperatures of other ICs or air temperature) and one for measuring its own junction temperature. Temperature sensor circuit 84 is explained in more detail with reference to FIG. 5.

A fourth member 86 of the set may be a gate-driver output block coupled to I/O pad 88. Power MOSFET gate driver circuit 86 drives I/O pad 88 from the programmable digital circuits 28. I/O pad 88 may be coupled to I/O pad 64 and/or I/O pad 76 through either of pullup resistors 92 and 94, respectively. Persons of ordinary skill ion the art will realize that resistors 92 and 94 are optional. An optional ramp resistor 96 may be coupled to I/O pad 64 or I/O pad 76. Gate driver circuit 90 is explained in more detail with reference to FIG. 7.

Figure 3:
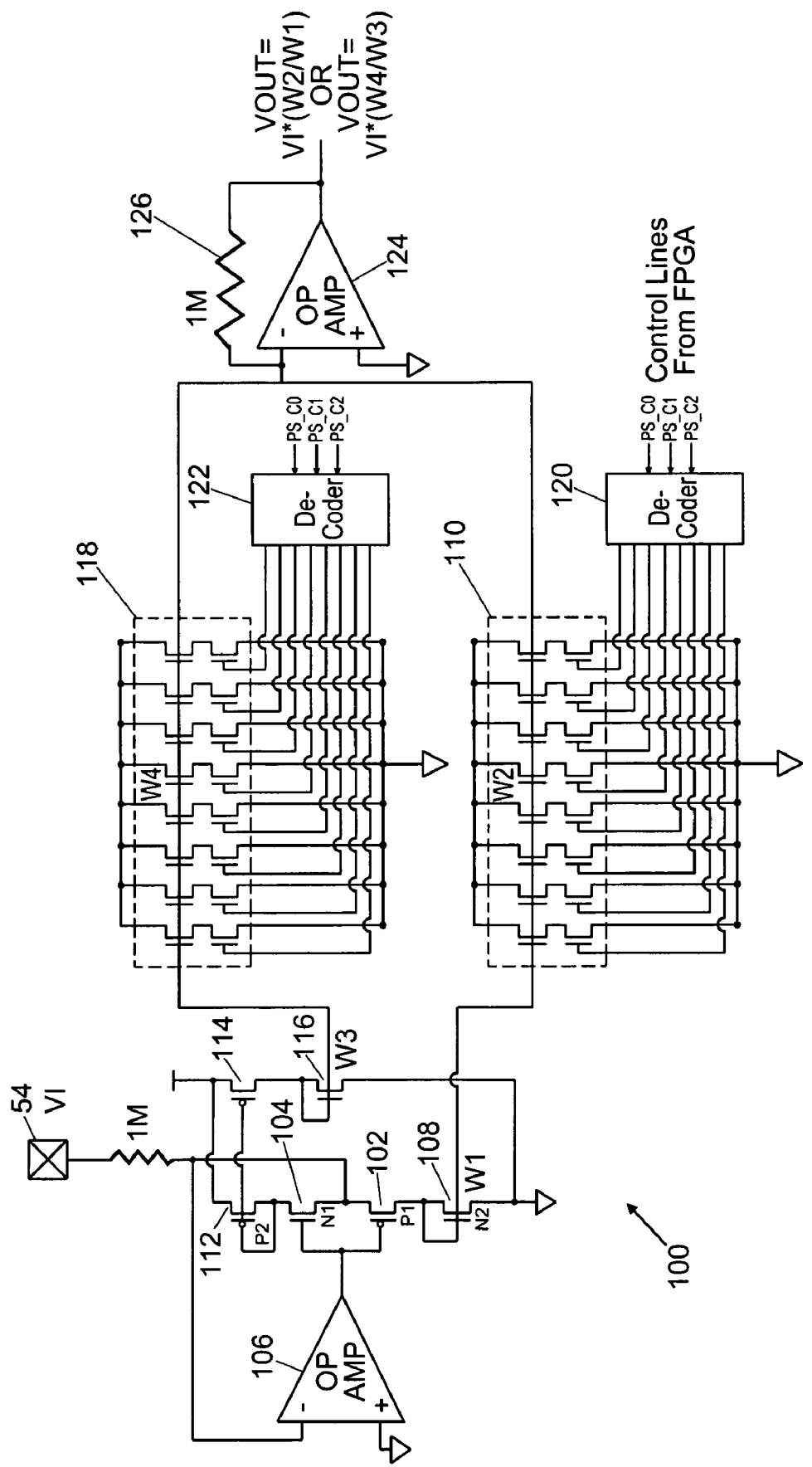
FIG. 3 is a diagram of a pre-scaler circuit that can scale external voltages by one of eight factors.

Referring now to FIG. 3, a diagram shows an illustrative pre-scaler circuit 100 that can scale external voltages by one of eight factors. According to one embodiment of the present invention, the pre-scaler circuits 56, 66, and 78 are provided to scale external voltages up or down. In FIG. 3, a pre-scaler circuit 100 is shown that can scale both positive and negative external voltages by one of eight factors. The pre-scaler circuit 100 of FIG. 3 can be used in voltage monitor functions or in any analog input functions. The pre-scaler circuit 100 may be based upon a current mirror circuit.

When an external positive voltage is applied to I/O pad 54, p-channel MOS transistor 102 is turned on and n-channel MOS transistor 104 is turned off through operational amplifier 106. The current through n-channel MOS transistor 108 having a channel width W1 is mirrored and scaled through the array 110 of n-channel MOS transistors having a cumulative width of W2. Thus, Vout=VI*(W2/W1).

When an external negative voltage is applied to I/O pad 54, p-channel MOS transistor 102 is turned off and n-channel MOS transistor 104 is turned on. The current through p-channel MOS transistor 112 is the same as the current through n-channel MOS transistor 104 and is mirrored through p-channel MOS transistor 114. This current is in turn mirrored by n-channel MOS transistor 116 having a channel width of W3. The current through n-channel MOS transistor 116 is mirrored and scaled through the array 118 of n-channel transistors having a cumulative width of W4. Thus, Vout=VI*(W4/W3).

The cumulative widths W2 and W4 of the n-channel MOS transistor arrays 104 and 118 are determined by which of the upper n-channel MOS transistors in each array are turned on by one of the lower transistors in the array. Each upper transistor has a different width and the gate of each lower transistor is driven from the output of decoders 120 (for positive scaling) and 122 (for negative scaling). The widths of n-channel MOS transistors 108, 116, and n-channel MOS transistor arrays 110 and 118 are selected to produce the desired scaling factors.

The control lines of decoder circuits 120 and 122 are driven from on-chip information that may be generated from, for example, an FPGA array, or a state machine. The outputs of n-channel MOS transistor arrays 110 and 118 are coupled together to the inverting input of operational amplifier 124. Resistor 126 sets the gain of operational amplifier 124.

According to one aspect of the invention, the following voltage-scaling factors: 0.20161, 0.40322, 0.80645, 1.6129, 3.2258, 6.45161, 12.90322, and 25.80645 have been found to be particularly useful. This is particularly useful where the full-scale voltage of A/D converter 42 of FIG. 1 is 3.3V. The choice of these eight scaling factors is controlled by three binary control signals coming from the programmable digital circuits 28. Using these factors 16V can be scaled down to 3.3V using the factor 0.20161 (16*0.20161=3.3) and 125 mv can be scaled up to 3.3V using the factor 25.80645 (0.125*25.80645=3.3). Hence the function of the pre-scaler is to convert input voltages into ranges that are acceptable by the A/D converter 42. The reason for employing the exemplary scaling factors recited herein is for user convenience to achieve correspondence between the digital output of the A/D converter 42 and one-millivolt steps. From an examination of this disclosure, persons of ordinary skill in the art will appreciate that any number of different scaling factors may be selected.

Figure 4:
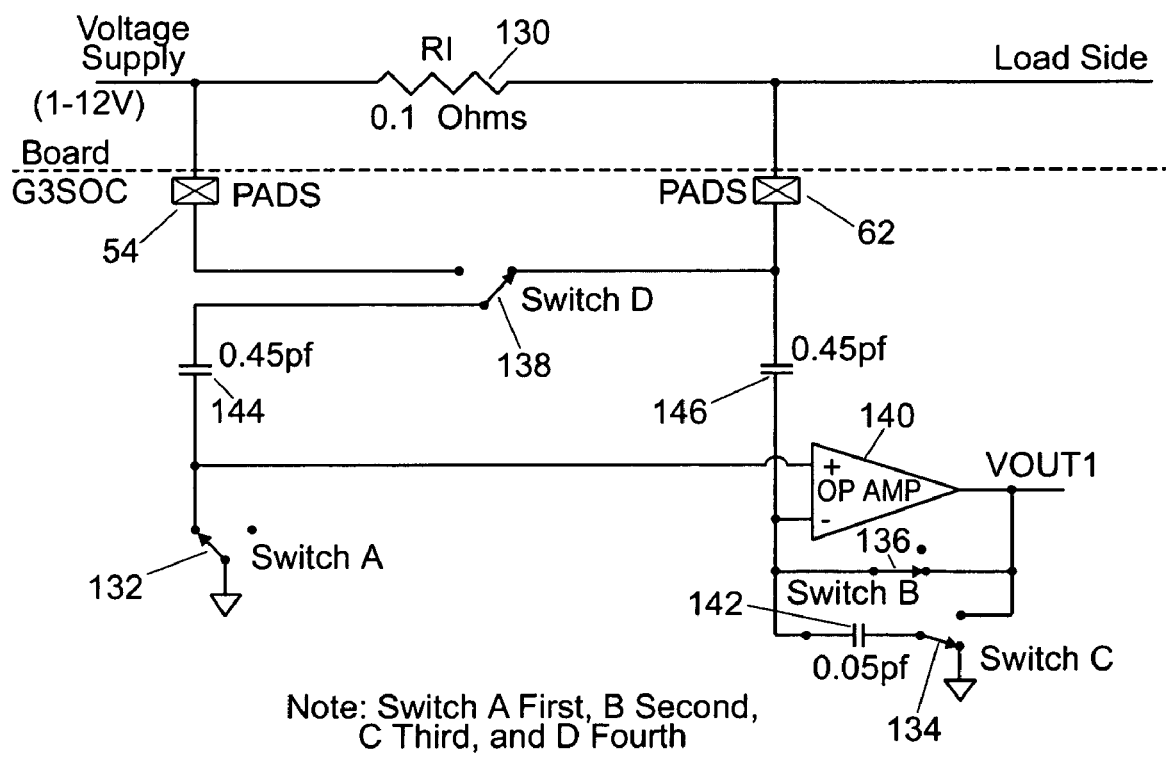
FIG. 4 is a diagram of an illustrative configuration for the amplifier in the current-sensing circuit of FIG. 2.

An illustrative configuration for amplifier 72 of FIG. 2 is shown and described with reference to FIG. 4. External resistor 130 is shown coupled between I/O pads 54 and 62. By the initial positions of switches 132, 134, 136, and 138 (shown in FIG. 9), the offset value of the operational amplifier 140 is stored in capacitor 142 so that the output of the operational amplifier 140 is approximately at ground. Also the capacitors 144 and 146 are charged to the voltage level, which is at the right side of the external resistor 130, and the non-inverting input of the operational amplifier 140 is at ground. The inverting input of operational amplifier 140 is at virtual ground. Switches 122, 124, 126, and 128 are then switched in order (first switch 122, then switch 134, then switch 136, then switch 138). After all the switches 132, 134, 136, and 138 are at their new positions, the voltage drop across the external resistor 130 is amplified by the operational amplifier 140 with a gain defined by (C146+C134)/C134. The output voltage of the operational amplifier 140 is applied to the input of the ADC. Since the value of the external resistor value is known, the current through the external resistor is known. The configuration of the circuit of FIG. 4 has the advantage of avoiding amplifying the voltage offset of operational amplifier 140.

Figure 5:
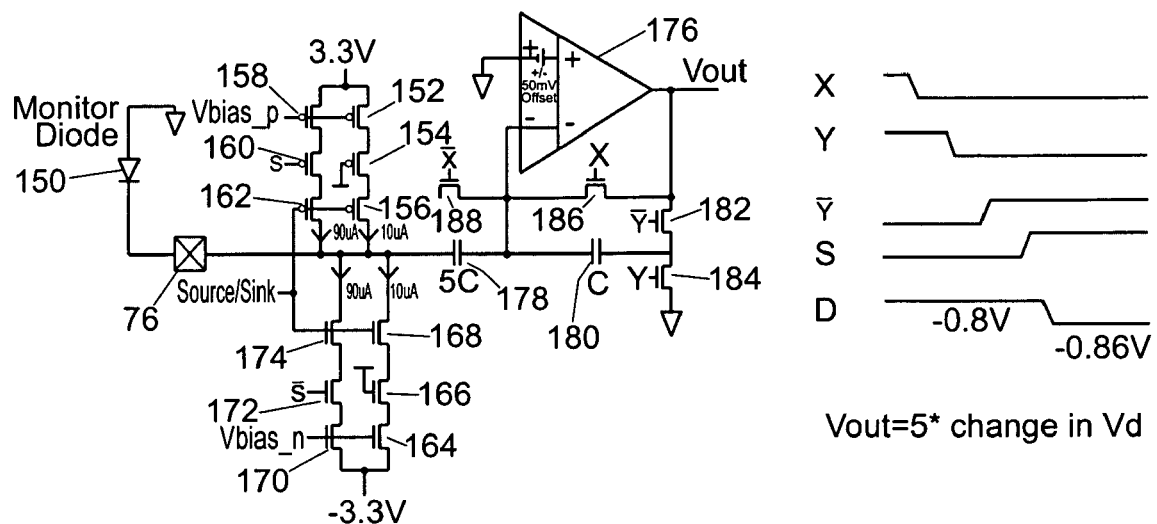
FIG. 5 is a diagram of an illustrative temperature sensing circuit that may be usefully employed in the multi-function analog circuit of FIG. 1.

Referring now to FIG. 5, temperature-sensor circuit 84 is explained in more detail. This circuit forces two different currents through a diode and measures the voltage drop difference across the diode. It then amplifies this voltage by a factor of five and sends it to the ADC. This amplified voltage difference directly corresponds to temperature (in ° K). Persons of ordinary skill in the art will appreciate that, while FIG. 5 shows an external diode, an internal diode could be employed to measure on-chip temperature.

For example, as shown in FIG. 5, a voltage difference of 59.6 mV (corresponding to diode temperature of 25° C.) is measured by sequentially forcing 10 uA and 100 uA across diode 150. This is amplified 5×—which gives 298 mV—which corresponds to 298K (25 C). Diode 150 is coupled to I/O pad 76. Two current-generating circuits are shown, allowing the diode 150 to be oriented in either direction. The first current-generating circuit which sources current includes a first leg including p-channel MOS transistors 152, 154, and 156 coupled in series between a supply potential of +3.3 VDC and the I/O pad 76. The gate of transistor 152 is coupled to a positive bias potential. The gate of transistor 154 is coupled to ground and the gate of transistor 156 is coupled to a Source/Sink control signal. The sizes of transistors 152, 154, and 156 and the value of the positive bias potential are chosen to cause 10 μA to flow (source) through diode 150.

The second leg in the first current-generating circuit includes p-channel MOS transistors 158, 160, and 162 coupled in series between the supply potential of +3.3 VDC and the I/O pad 76. The gate of transistor 158 is coupled to the positive bias potential. The gate of transistor 160 is coupled to a control signal "S" and the gate of transistor 162 is coupled to the Source/Sink control signal. The sizes of transistors 158, 160, and 162 and the value of the positive bias potential are chosen to cause an additional 90 μA to flow (source) through diode 150.

Similarly, The second current-generating circuit which sinks current includes a first leg including n-channel MOS transistors 164, 166, and 168 coupled in series between a supply potential of −3.3 VDC and the I/O pad 76. The gate of transistor 164 is coupled to a negative bias potential. The gate of transistor 166 is coupled to a positive voltage and the gate of transistor 168 is coupled to the Source/Sink control signal. The sizes of transistors 164, 166, and 168 and the value of the negative bias potential are chosen to cause 10 μA to flow (sink) through diode 150.

The second leg in the first current-generating circuit includes n-channel MOS transistors 170, 172, and 174 coupled in series between the supply potential of −3.3 VDC and the I/O pad 76. The gate of transistor 170 is coupled to the negative bias potential. The gate of transistor 172 is coupled to the control signal "S" and the gate of transistor 174 is coupled to the Source/Sink control signal. The sizes of transistors 170, 172, and 174 and the value of the negative bias potential are chosen to cause 90 μA to flow (sink) through diode 150.

If the Source/Sink control signal is low, the current sourcing transistors operate. If the Source/Sink control signal is high, the current sinking transistors operate. In either case, the first leg of the circuit (either transistors 152, 154, and 156 or transistors 164, 166, and 168) are turned on, sourcing or sinking 10 μA through diode 150. When the "S"

(or "S!") signal is asserted, the second leg of the circuit (either transistors 158, 160, and 162 or transistors 170, 172, and 174) is also turned on, sourcing or sinking a total of 100 μA through diode 150.

The remaining components of the circuit include operational amplifier 176 having its non-inverting input grounded, capacitor 178 coupled between I/O pad 76 and the inverting input of operational amplifier 176, and capacitor 178, coupled between the inverting input of operational amplifier 176 and its output through n-channel MOS transistor 182. In the example of FIG. 5, capacitor 178 has five times the capacitance of capacitor 180, which determines the gain of the circuit. Capacitor 180 stores and thus cancels the offset of operational amplifier 176.

The common connection of capacitor 180 and transistor 182 is coupled to ground through n-channel MOS transistor 184. The gate of transistor 182 is coupled to a control signal Y! and the gate of transistor 184 is connected to a control signal Y. An n-channel MOS transistor 186 is coupled between the inverting input sand the output of operational amplifier 176 and has its gate coupled to a control signal X. An n-channel MOS transistor 188 is coupled to the inverting input of operational amplifier 176 and has its gate coupled to a control signal X!. The relative timing of the control signals X, Y, Y! and S is shown at the right side of FIG. 5. The difference in diode voltage before and after the timing sequence is amplified by the circuit gain and appears at the output of the operational amplifier 166, corresponding to the absolute temperature.

Persons of ordinary skill in the art will appreciate that the actual current source and sink levels, supply voltage values circuit gains can be changed without changing the nature of the circuit operation. In addition, such skilled persons will realize that, while a single-ended circuit is shown in FIG. 5, a differential circuit could be used to measure the voltage across the diode.

Figure 6:
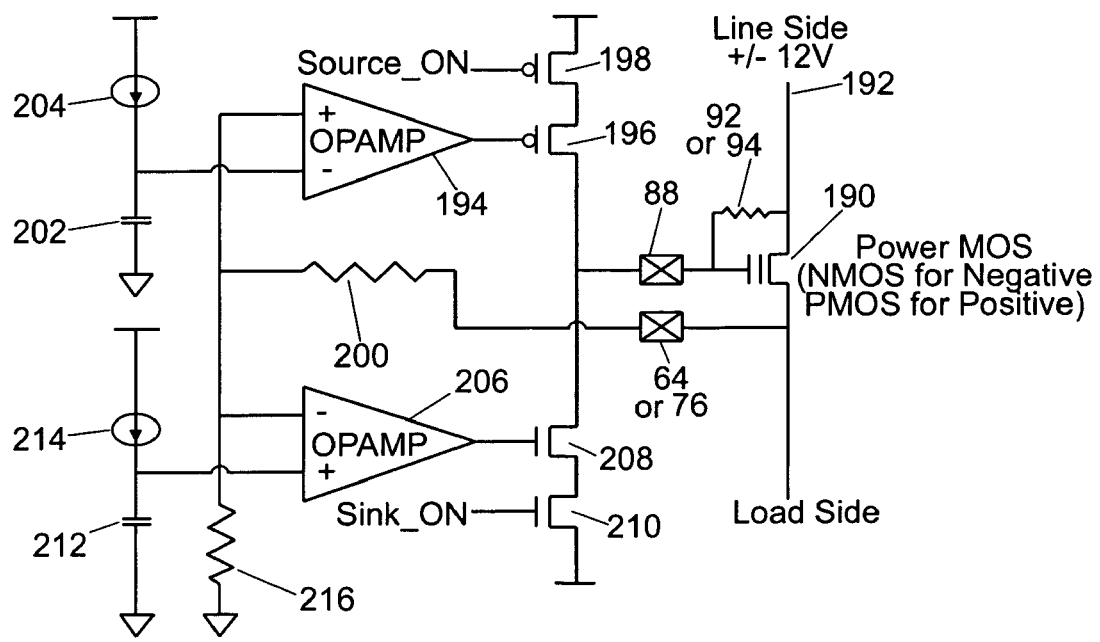
FIG. 6 is a diagram of an illustrative gate drive circuit that may be usefully employed in the multi-function analog circuit of FIG. 1.

Referring now to FIG. 6, the operation of a gate driver circuit like the one of FIG. 2 is explained in more detail. External power MOSFET 190 has its source coupled to supply potential 192. Its gate is coupled to I/O pad 88 and its drain is coupled to I/O pad 64 or 76 (see FIG. 2). If supply potential 192 is positive, power MOSFET 190 will be a p-channel device and if supply potential 192 is negative, power MOSFET 190 will be an n-channel device. Resistor 92 or 94 (again see FIG. 2) may be disposed outside of the integrated circuit device and are used to assure that the power MOSFET 190 will be turned off unless a gate drive signal is supplied at I/O pad 88.

Operational amplifier 194 drives the gate of p-channel MOS gate-drive transistor 196. The drain of p-channel MOS gate-drive transistor 196 is coupled to I/O pad 88. The source of p-channel MOS transistor gate-drive transistor 196 is coupled to a positive supply potential through p-channel MOS enable transistor 198. The non-inverting input of operational amplifier 194 is coupled to the drain of power MOSFET 190 via I/O pad 64 (or 76) through resistor 200. The inverting input of operational amplifier 198 is coupled to capacitor 202 driven by constant-current source 204.

Similarly, operational amplifier 206 drives the gate of n-channel MOS gate-drive transistor 208. The drain of n-channel MOS gate-drive transistor 208 is coupled to I/O pad 88. The source of n-channel MOS transistor gate-drive 208 is coupled to a negative supply potential through n-channel MOS enable transistor 210. The inverting input of operational amplifier 206 is coupled to the drain of external power MOSFET 190 via I/O pad 64 (or 76) through resistor 200. The non-inverting input of operational amplifier 206 is coupled to capacitor 212 driven by constant-current source 214. The non-inverting input of operational amplifier 194 and the inverting input of operational amplifier 206 are coupled to ground through resistor 216.

In the example shown in FIG. 6 where an n-channel MOS power transistor 190 is to be driven, p-channel enable transistor 198 is turned on. To turn on n-channel MOS power transistor 190, current source 204 is turned on and charges capacitor 202 at a linear rate. The voltage on capacitor 202 is amplified with a negative gain, producing a decreasing ramp voltage at the output of operational amplifier 194. This causes a decreasing ramp voltage at the drain of p-channel gate drive transistor 196 to turn on p-channel MOS power transistor 190. The final gate voltage on the external MOS power transistor 190 is established by the IR drop across the gate-to-source resistor 92 or 94 and is determined by the current through the p-channel enable transistor 198. If it is desired to turn on an external p-channel MOS power transistor, n-channel enable transistor 210 is turned on, current source 214 is turned on and charges capacitor 212 at a linear rate. The voltage on capacitor 212 is amplified with a positive gain, producing an increasing ramp voltage at the output of operational amplifier 206. This causes an increasing ramp voltage at the drain of n-channel gate drive transistor 208 to turn on the external p-channel MOS power transistor. The feedback provided to the operational amplifiers 194 and 206 through resistor 200 assures controlled ramp rates on the load.

Figure 7:
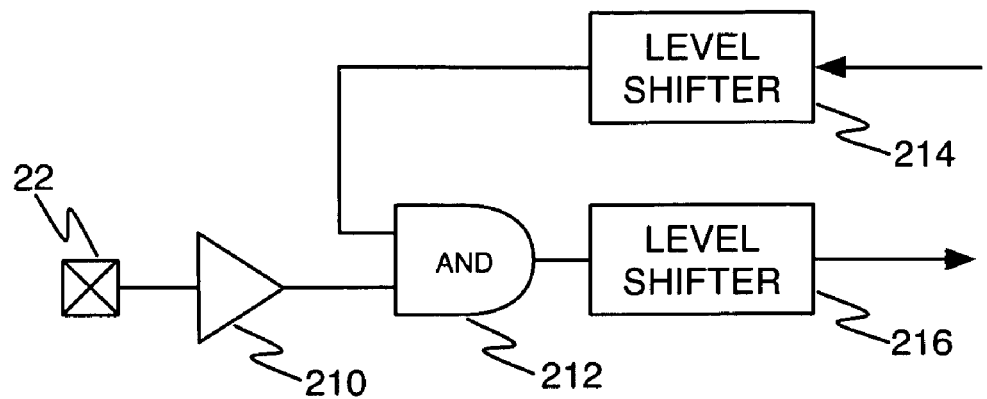
FIG. 7 is a schematic diagram of an illustrative digital input circuit that may be coupled to the same I/O pad a one of the sensing circuits of the present invention.

FIG. 7 is a schematic diagram of an illustrative digital input circuit like 60, 70, or 82 of FIG. 2 that may be coupled to the same I/O pad as one of the sensing circuits of the present invention. Buffer 220 is shown coupled to illustrative I/O pad 22. Buffer 220 is designed with hysteresis at its input as is known in the art. The output of buffer 220 is coupled to one input of AND gate 222. The other input of AND gate 222 is coupled to the output of level-shifter circuit 224. Level-shifter circuit 224 is configured to shift logic levels from those used in the programmable digital circuits 28 of FIG. 1 (such as 1.5V) to off-chip logic levels (such as 3.3V). The output of AND gate 222 is coupled to the input of level-shifter circuit 226. Level-shifter circuit 226 is configured to shift logic levels from off-chip logic levels (such as 3.3V) to those used in the programmable digital circuits 28 of FIG. 1 (such 1.5V).

The circuit of FIG. 7 allows the digital input to be enabled. If a logic zero is presented to the input of level-shifter circuit 224, the output of AND gate 222 is forced to zero. If a logic one is presented to the input of level-shifter circuit 224, the output of AND gate 222 follows the logic state at the I/O pad 22.

Figure 8:
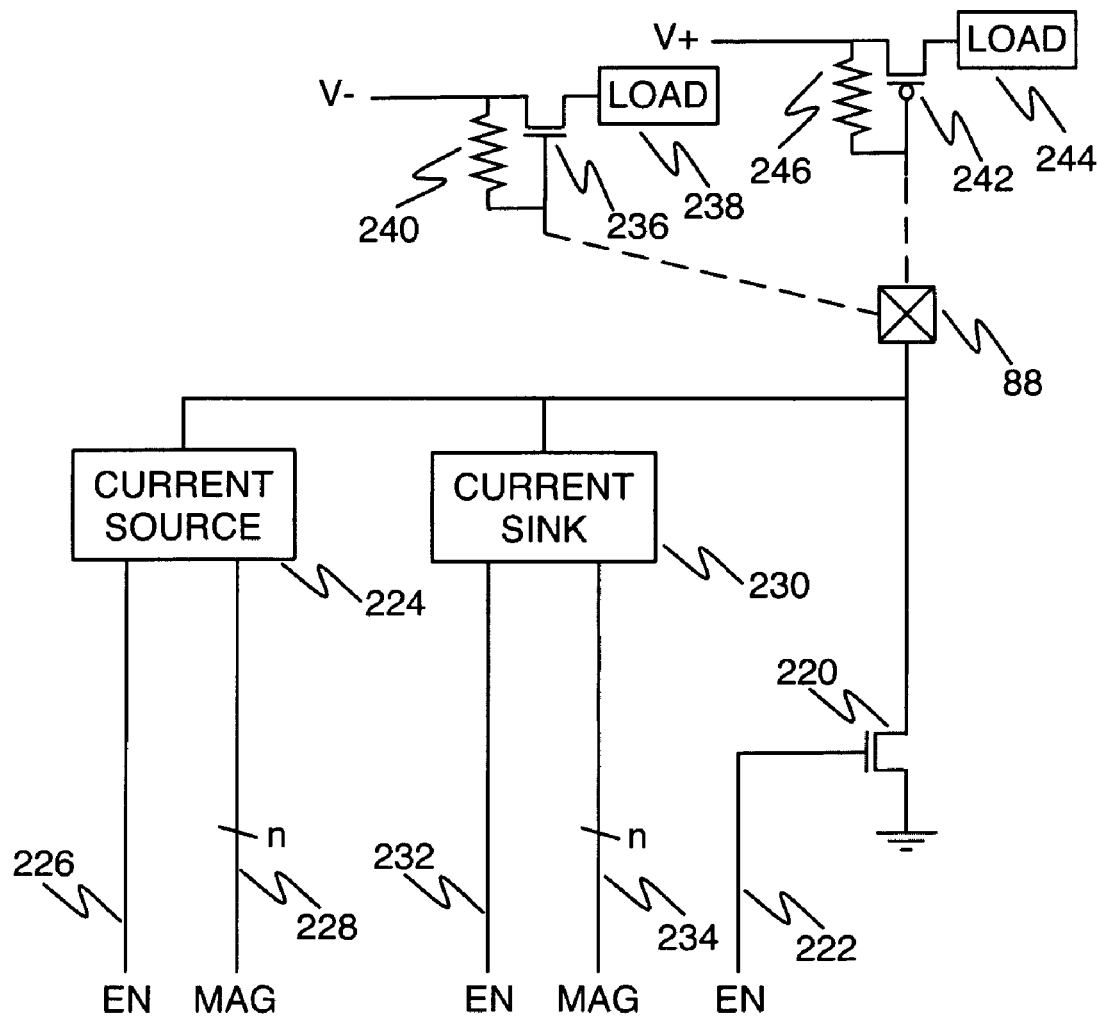
FIG. 8 is a schematic diagram of an alternative illustrative gate-drive circuit that may be usefully employed in the multi-function analog circuit of FIG. 1.

Referring now to FIG. 8, a schematic diagram shows an alternative illustrative gate-drive circuit that may be usefully employed in the multi-function analog circuit of FIG. 1. The circuit of FIG. 8 not only provides gate drive for external devices but can also pull I/O pad 88 down to ground if the voltage at I/O pad 88 is positive and can pull I/O pad 88 up to ground if the voltage at I/O pad 88 is negative.

I/O pad 88 is coupled to the drain of n-channel MOS transistor 230. The source of n-channel MOS transistor 230 is coupled to ground. The gate of n-channel MOS transistor 230 is coupled to an enable signal line 232 that is driven from an output in the programmable digital circuit 28 of FIG. 1. If the signal on the enable line 232 is at ground, n-channel MOS transistor 230 is turned off. If the signal on enable line 232 is at a logic one, n-channel MOS transistor 230 is turned on and can pull I/O pad 88 down to ground if the voltage at I/O pad 88 is positive and can pull I/O pad 88 up to ground if the voltage at I/O pad 88 is negative.

Current-source circuit 234 is also coupled to I/O pad 88. It has an enable input line 236 and a magnitude input bus 238. Current-sink circuit 240 is also coupled to I/O pad 88. It has an enable input line 242 and a magnitude input bus 244. The enable lines and magnitude input busses 236, 238, 242, and 244 are driven from an output in the programmable digital circuit 28 of FIG. 1.

When enabled, current-source circuit 234 and current-sink circuit 240 may, respectively, source current to or sink current from I/O pad 88. Preferably, several different current levels may be programmably current limited. In an illustrative embodiment of the invention, these current levels may be, for example, 1 µA, 3 µA, 10 µA, and 30 µA. Specific embodiments of the invention will employ current levels as a matter of design choice.

In application, an external MOS power transistor has its gate coupled to I/O pad 88. An external resistor is coupled between the source of the external transistor and I/O pad 88. For example, external n-channel MOS transistor 246 is shown with its source coupled to a potential V- and its drain coupled to a load 248. A resistor 250 is coupled between the source and gate of external n-channel MOS transistor 246. A dashed line indicates a connection between the gate of external n-channel MOS transistor 246 and I/O pad 88.

To drive external n-channel MOS transistor 246, enable lines 232 and 242 are disabled to disable n-channel MOS transistor 230 and current sink circuit 240. Enable line 236 is enabled to enable current source circuit 234. Data representing the desired current source magnitude are placed on magnitude bus 238.

Similarly, external p-channel MOS transistor 252 is shown with its source coupled to a potential V- and its drain coupled to a load 254. A resistor 256 is coupled between the source and gate of external p-channel MOS transistor 252. A dashed line indicates a connection between the gate of external p-channel MOS transistor 252 and I/O pad 88.

To drive external p-channel MOS transistor 252, enable lines 232 and 236 are disabled to disable n-channel MOS transistor 230 and current source circuit 234. Enable line 242 is enabled to enable current sink circuit 240. Data representing the desired current source magnitude are placed on magnitude bus 244.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. An integrated multi-function analog circuit including:
   at least one MOSFET gate-drive circuit coupled to a first I/O pad;
   at least one voltage-sensing circuit coupled to a second I/O pad;
   at least one current-sensing circuit coupled to the second I/O pad and a third I/O pad; and
   at least one temperature-sensing circuit coupled to a fourth I/O pad.

2. The integrated multi-function analog circuit of claim 1 wherein the at least one voltage-sensing circuit includes a programmable voltage-prescaling circuit having an input coupled to the second I/O pad and an output.

3. The integrated multi-function analog circuit of claim 2 wherein the programmable voltage-prescaling circuit is adapted to prescale both positive and negative voltages.

4. The integrated multi-function analog circuit of claim 2 further including a voltage-sensing analog multiplexer having a first data input coupled to the second I/O pad and a second data input coupled to the output of the programmable voltage-prescaling circuit.

5. The integrated multi-function analog circuit of claim 1 wherein the current sensing circuit includes:
   a voltage sensing circuit having an input coupled to said third I/O pad; and
   a differential amplifier having a first input coupled to said second I/O pad and a second input coupled to said third I/O pad.

6. The integrated multi-function analog circuit of claim 5 wherein the voltage-sensing circuit in the current sensing circuit further includes a second programmable voltage-prescaling circuit having an input coupled to the third I/O pad and an output.

7. The integrated multi-function analog circuit of claim 6 wherein the second programmable voltage-prescaling circuit is adapted to prescale both positive and negative voltages.

8. The integrated multi-function analog circuit of claim 6 further including a second voltage-sensing analog multiplexer having a first data input coupled to the third I/O pad and a second data input coupled to the output of the second programmable voltage-prescaling circuit.

9. The integrated multi-function analog circuit of claim 1 wherein said at least one temperature-sensing circuit includes a third programmable voltage prescaling circuit having an input coupled to the fourth I/O pad and an output.

10. The integrated multi-function analog circuit of claim 9 further including a third voltage-sensing analog multiplexer having a first data input coupled to said fourth I/O pad and a second data input coupled to the output of said third programmable voltage-prescaling circuit.

11. The integrated multi-function analog circuit of claim 1 further including a digital input circuit coupled to one of said second, third, and fourth I/O pads.

12. The integrated multi-function analog circuit of claim 1 further including a digital input circuit coupled to said second, third, and fourth I/O pads.

13. The integrated multi-function analog circuit of claim 1 wherein said gate-driver circuit includes:
   a first operational amplifier having a non-inverting input coupled to ground through a first resistor, an inverting input coupled to a first current source disposed in series with a first capacitor, and an output;
   a second operational amplifier having an inverting input coupled to ground through the first resistor, a non-inverting input coupled to a second current source disposed in series with a second capacitor, and an output;
   a p-channel MOS transistor having a gate coupled to the output of the first operational amplifier; a source coupled to a positive power-supply potential, and a drain coupled to the first I/O pad;
   an n-channel MOS transistor having a gate coupled to the output of the second operational amplifier; a source coupled to a negative power-supply potential, and a drain coupled to the first I/O pad;
   a second resistor switchably coupled between the non-inverting input of the first operational amplifier and either of the third and fourth I/O pads.

* * * * *